United States Patent [19]
Nelson et al.

[11] Patent Number: 5,328,087
[45] Date of Patent: Jul. 12, 1994

[54] THERMALLY AND ELECTRICALLY CONDUCTIVE ADHESIVE MATERIAL AND METHOD OF BONDING WITH SAME

[75] Inventors: Richard D. Nelson; Thomas P. Dolbear; Robert W. Froehlich, all of Austin, Tex.

[73] Assignee: Microelectronics and Computer Technology Corporation, Austin, Tex.

[21] Appl. No.: 38,420

[22] Filed: Mar. 29, 1993

[51] Int. Cl.$^5$ .............................................. H01L 21/58
[52] U.S. Cl. .............................. 228/175; 228/180.22; 29/830; 361/779; 156/273.9
[58] Field of Search .............. 228/175, 180.22, 180.21; 156/273.9, 306.9, 310; 29/830; 361/779

[56] References Cited
U.S. PATENT DOCUMENTS

| | | | |
|---|---|---|---|
| 3,141,238 | 7/1964 | Herman, Jr. | 228/248 |
| 3,372,310 | 3/1968 | Kanter | 357/75 |
| 3,395,443 | 8/1968 | Polinko, Jr. | 228/208 |
| 3,805,123 | 4/1974 | Rieger | 357/75 |
| 4,098,452 | 7/1978 | Webster et al. | 228/209 |
| 4,233,103 | 11/1980 | Shaheen | 228/233.2 |
| 4,299,715 | 11/1981 | Whitfield et al. | 252/74 |
| 4,398,975 | 8/1983 | Ohsawa et al. | 148/400 |
| 4,403,410 | 9/1983 | Robinson | 29/830 |
| 4,410,457 | 10/1983 | Fujimura et al. | 252/508 |
| 4,435,611 | 3/1984 | Ohsawa et al. | 174/68.5 |
| 4,442,966 | 4/1984 | Jourdain et al. | 228/123 |
| 4,448,240 | 5/1984 | Sharon | 165/80 |
| 4,515,304 | 5/1985 | Berger | 228/136 |
| 4,604,644 | 8/1986 | Beckham et al. | 357/80 |
| 4,611,745 | 9/1986 | Nakahasi et al. | 228/123 |
| 4,732,702 | 3/1988 | Yamazaki et al. | 252/512 |
| 4,740,252 | 4/1988 | Hasegawa et al. | 148/24 |
| 4,740,830 | 4/1988 | Ketley | 357/67 |
| 4,744,850 | 5/1988 | Imano et al. | 361/779 X |
| 4,749,120 | 6/1988 | Hatada | 228/180.22 |
| 4,769,525 | 9/1988 | Leatham | 228/123 |
| 4,769,690 | 9/1988 | Suzuki et al. | 357/67 |
| 4,796,157 | 1/1989 | Ostrem | 357/81 |
| 4,804,132 | 2/1989 | DiFrancesco | 228/208 |
| 4,875,617 | 10/1989 | Citowsky | 228/123 |
| 4,929,597 | 5/1990 | Takeshita et al. | 29/599 |
| 4,949,220 | 8/1990 | Tashiro | 357/81 |
| 4,995,546 | 2/1991 | Regnault | 228/208 |
| 5,019,201 | 5/1991 | Yabu et al. | 156/273.9 |
| 5,024,264 | 6/1991 | Natori et al. | 165/1 |
| 5,031,308 | 7/1991 | Yamashita et al. | 29/830 |
| 5,053,195 | 10/1991 | MacKay | 420/555 |
| 5,056,706 | 10/1991 | Dolbear et al. | 228/180.2 |
| 5,062,896 | 11/1991 | Huang et al. | 106/287.19 |
| 5,147,210 | 9/1992 | Patterson et al. | 29/830 X |
| 5,170,930 | 12/1992 | Dolbear et al. | 228/123 |
| 5,183,969 | 2/1993 | Odashima | 156/273.9 |
| 5,225,157 | 7/1993 | McKay | 420/525 |
| 5,235,741 | 8/1993 | Mase | 29/830 |
| 5,258,577 | 11/1993 | Clements | 361/779 X |

OTHER PUBLICATIONS

"IBM Technical Disclosure Bulletin" vol. 31, No. 5, Oct. 1988, pp. 34–35.

Hansen, Constitution of Binary Alloys, McGraw-Hill, 1958, p. 22 & 96.

Keeler, "Liquid Interconnects For Fine Pitch Assembly?" *Electronic Packaging & Production*, vol. 14, Jun. 1989 pp. 14–15.

(List continued on next page.)

*Primary Examiner*—Kenneth J. Ramsey
*Attorney, Agent, or Firm*—David M. Sigmond

[57] ABSTRACT

The present invention discloses a thermally and electrically conductive adhesive material comprising a hardened adhesive, and a non-solidified filler containing a liquid metal dispersed in separate spaced regions of the adhesive. The hardened adhesive provides a mechanical bond whereas the filler provides continuous thermal and electrical metal bridges, each bridge extending through the adhesive and contacting the bonded surfaces. The method includes (a) dispersing a filler containing a liquid metal into an unhardened adhesive, (b) contacting the unhardened adhesive and the filler in non-solidified state to the surfaces resulting in separate spaced regions of the non-solidified filler contacting both surfaces, and (c) hardening the adhesive.

68 Claims, 7 Drawing Sheets

OTHER PUBLICATIONS

Glushkova et al., "Gallium-Copper and Gallium-Nickel Paste Solders," *Svar. Proiz.*, No. 11, 1968, pp. 36-37.

Tikhomirova, et al., "Soldering Copper with Copper-Gallium Solders," *Svar. Proiz.*, No. 10, 1967, pp. 16-18.

Harman, "Hard Gallium Alloys for Use as Low Contact Resistance Electrodes and for Bonding Thermocouples into Samples," *The Review of Scientific Instruments*, vol. 31, No. 7, Jul. 1960, pp. 717-720.

Tikhomirova, et al., "Effect of the Particle Shape and Size of a Second Component on the Properties of the Gallium Solders," *Poroshkovaya Metallurgiya*, No. 12 (84), Dec. 1969, pp. 51-56.

Darveaux et al., "Thermal/Stress Analysis of a Multichip Package Design," *Proceedings of the 39th Electronic Components Conference*, 1989, pp. 668-671.

Nayak et al., "A High Performance Thermal Module for Computer Packaging," *Journal of Electronic Materials*, vol. 16, No. 5, 1987, pp. 357-364.

Hwang et al., "A Thermal Module Design for Advanced Packaging," *Journal of Electronic Materials*, vol. 16, No. 5, 1987, pp. 347-355.

Product Brochure entitled "INDALLOY TM Fusible Alloys Available" by Indium Corporation of America, Utica, N.Y. (date unknown) pp. 1-5.

Product Brochure entitled "Z link TM Multilayer Technology" by Sheldahl, Inc., Northfield, Minn., (date unknown) pp. 1-8.

Technical Bulletin entitled "DieGlas TM Die Attach Material Processing Recommendations" by Alphametals, Jersey City, N.J., Feb. 1992, pp. 1-2.

Product Brochure entitled "High Performance Electronic Materials Manufactured by A. I. Technology, Inc." by A. I. Technology, Inc., Princeton, N.J. (date unknown) pp. 1-5.

P. Bujard, "Thermal Conductivity of Boron Nitride Filled Epoxy Resins: Temperature Dependence Influence of Sample Penetration", *Intersociety Conference on THERMAL Performance in the Fabrication and Operation of Electronic Components* 1988, Los Angeles, Calif., May 11-13, 1988, pp. 41-49.

Thomas Dolbear, "Liquid Metal Paste for Thermal Connections", *Proceedings of the International Electronic Packaging Society (IEPS)*, Sep., 1992, pp. 475-485.

THERMALLY AND ELECTRICALLY CONDUCTIVE ADHESIVE MATERIAL AND METHOD OF BONDING WITH SAME

BACKGROUND OF THE INVENTION

1. Field of the invention

The invention relates to adhesive bonding materials, and more particularly to an adhesive material containing an adhesive and a filler, the filler containing a liquid metal, for making thermally and electrically conductive bonds between electronic components, as well as a method for making such bonds.

2. Description of Related Art

Packaging of electronic components involves establishing interconnections and a suitable operating environment for predominantly electrical circuits to process or store information. The quest for higher levels of integration drives technologies to produce smaller and smaller devices, interconnections and terminals. This demands increased power capability to supply high currents at tight voltage-drop tolerances.

Increased power consumption generates increased heat. Thermal expansion caused by heating up the components, however, is not uniform. Thermal expansion varies with temperature gradients and mismatches between coefficients of thermal expansion. Mechanical stresses result from these differences which contribute to the finite lifetime and failure rate of the components. Moreover, the components have limited temperature tolerance. For instance, integrated circuit chip temperatures must normally be below 100° C. to assure proper and reliable electrical performance. As a result, heat transfer and heat removal techniques have become critical.

An important aspect of heat conduction in microelectronic packages is the transfer of heat across the interface of two surfaces, for example an integrated circuit chip mounted on an electrical interconnect substrate. Generally, when two surfaces are pressed together the contact is imperfect and the real heat transfer area of the joint is only a small fraction of the total area. This constriction and then spreading of the heat flux in the vicinity of the joint is manifested by a temperature drop at the interface, which results in increased thermal resistance.

Thermally conductive adhesives with dispersed solids have been devised for heat sink attachment of electrical components and for attachment of integrated circuit chips to substrates and other packaging structures. For instance, silver filled epoxies for electrical and thermal interface connections are well known. The main goal is to provide both a dependable mechanical bond and a highly conductive path for heat flow. Although the basic theory of this method appears sound, in practice this method may have serious drawbacks. Since the thermal conductivity of such adhesives depends on the ability of the solids within the adhesives to contact each other and the surfaces to be joined, limited contact areas introduce constriction resistance and reduce the thermal conductance of the joint. Similar problems arise for electrically conductive adhesives resulting in reduced electrical conductance.

There has been some recent activity directed towards overcoming this primary shortcoming. A main thrust has been the use of low temperature solder (or fusable alloy) fillers with melting points (or melting ranges for non-eutectics) between approximately 40° C. and 100° C. A bond is formed by melting and resolidifying the metal. Tin, gold, solder and various alloys may be used.

Solder fillers can be liquid at the cure temperature of the adhesive thereby enhancing the surface contact and later solidify at room temperature. Such solder fillers include tin-bismuth based solders (e.g., 52/30/18 Bi/Pb/Sn) and indium-based solders (e.g., 95/5 Ga/In, 66.3/33.7 In/Bi). For example, U.S. Pat. No. 5,062,896 by Wu-Song Huang discloses a paste which contains a meltable alloy (solders of the Bi/Sn, Bi/Sn/Pb, and Pb/Sn systems) in a solution of a polymer dissolved in a solvent such as NMP with a transient fluxing agent and an optional surfactant. Solder reflow occurs at a temperature in the range of approximately 160° C. to 250° C. The fluxing agent is driven off primarily as vapor during reflow and the surfactant if present is likewise driven off as a gaseous by-product of the process. The joint appears to contain a solid solder connection throughout its operation.

Fusion bonding is reported by Sheldahl, Inc. of Northfield, Minn. in a product brochure entitled "Z LINK TM Multilayer Technology". Sheldahl uses a solder filled polymer to make electrical connections between copper traces on printed circuit board laminates by creation of fusion bonds. The product brochure does not call out melting the solder but this seems to be preferable and require a reflow temperature on the order of 160° C. Likewise, the brochure fails to call for flux but flux and/or an acidic preclean of the surfaces being joined appears necessary to insure proper wetting.

Although rendering solder fillers molten provides better surface contact than, say, silver filled epoxies, significant drawbacks arise, particularly after resolidification. Solders appear to require heating well above their melting point (approx. 100° C.) to wet the surfaces being joined, require flux unless the surfaces are reduced immediately prior to bonding, lack physical compliance, are prone to deformation and fatigue, and are unable to wet most materials besides metals.

Other known methods of making thermally conductive joints include the use of greases, viscous liquids or liquid metals between surfaces. These methods, however, fail to provide structural or adhesive support and, further, the grease or liquid can migrate out of the interface, destroying its conductance or contaminating other parts of the assembly.

The electrical characteristics of packaging interconnections are also key performance denominators. Signal interconnections and terminals constitute the majority of conducting elements, whereas other conductors supply power and provide ground or other reference voltages. Connections between chip and package are commonly performed by one of three technologies: wirebond, tape-automated-bonding (TAB), and Controlled Collapse Chip Connection (C4) also called "flip chip". The best approach depends on thermal considerations, the number and spacing of I/O connections on the chip, and cost. Whichever the approach, an electrically conductive connection must be made between the chip and an external lead or component. Moreover, it is often desirable for the connection to be thermally conductive as well.

Consequently, there is a need for bonding electrical components with an adhesive material having strong mechanical strength as well as high thermal and electrical conductivity.

SUMMARY OF THE INVENTION

An object of the present invention is to provide an adhesive material for making thermal and/or electrical connections between surfaces with improved thermal and/or electrical conduction characteristics.

The present invention discloses a thermally and electrically conductive adhesive material comprising a hardened adhesive and a non-solidified filler containing a liquid metal dispersed in separate spaced regions of the adhesive. The hardened adhesive provides a mechanical bond whereas the filler in the regions provides continuous thermal and electrical metal "bridges" extending through the adhesive between and in contact with the bonded surfaces.

A feature of the present invention is a method of bonding two surfaces with a thermally and electrically conductive adhesive material, comprising (a) dispersing a filler containing a liquid metal into an unhardened adhesive, (b) contacting the unhardened adhesive and the filler in non-solidified state to the surfaces resulting in separate spaced regions of the non-solidified filler contacting both surfaces, and (c) hardening the unhardened adhesive to form a harder adhesive which provides a mechanical bond between the surfaces wherein the filler in each region provides a separate continuous thermally and electrically conductive metal bridge between and in contact with the surfaces.

In certain preferred embodiments of the present invention the liquid metal can be gallium; the filler can be a liquid metal, a liquid metal alloy, a non-solidifying paste comprising a liquid metal and particulate solid constituents, or an amalgam; and the adhesive can be a thermoplastic material, a thermosetting material, an ultraviolet curable material, an epoxy, a silicone gel or a solvent-bearing material. Various combinations of these materials are also suitable.

The filler may be dispersed into the unhardened adhesive by mixing filler into a liquid adhesive or partially cured adhesive. Or the filler may be dispersed in a flexible adhesive film by forming vias in the film and then depositing filler into the vias.

The filler must be non-solidified during contact with the surfaces. However, it is critical to note that the filler may be dispersed in the unhardened adhesive in liquid or solid state, and need not necessarily remain non-solidified after it contacts the surfaces to be bonded. The filler may remain non-solidified as the adhesive is hardened and later solidify by amalgamation or temperature decrease. If later solidified, the filler may again be rendered non-solidified by temperature increase in order to facilitate shearing the bond during rework.

The adhesive material of the present invention can also be used to provide a thermally conductive, electrically resistive bond if the regions of filler in the hardened adhesive fail to provide continuous paths between the bonded surfaces. Alternatively, one of the bonded surfaces can be coated with an insulating material prior to applying the adhesive material.

In still another embodiment of the present invention, the filler regions form anisotropic electrical connections between matching pairs of electrical pads on the bonded surfaces without connecting any non-matching pads.

A primary advantage of the present invention is the ability to make more extensive thermal and electrical contact between the joined surfaces than is possible with conventional solid particle fillers.

Another advantage of the present invention is the ability to bond at temperatures in the range of approximately 5° C. to 30° C., depending on the melting point of the liquid metal or liquid metal alloy.

A further advantage of the present invention is the wide variety of adhesives which may be used in comparison to solder-based filler compositions.

An additional advantage of the present invention is the ability to bond surfaces having highly different coefficients of thermal expansion.

Yet a further advantage of the present invention is a low elastic modulus resulting in relatively low stresses placed on the bonded surfaces.

Still another advantage of the present invention is the ability of the filler to wet surfaces, particularly ceramics such as alumina and aluminum nitride, and thus make wide-area surface contact without the need for flux or acidic precleaning of the surfaces.

Yet a further advantage of the present invention is the need for a relatively low assembly pressure.

A still further advantage of the present invention is the ability to form electrically conductive thermal bonds between integrated circuit chips and electrical interconnect substrates.

These and other objects, features and advantages of the present invention will be further described and more readily apparent from a review of the detailed description and preferred embodiments which follow.

BRIEF DESCRIPTION OF THE DRAWINGS

The following detailed description of the preferred embodiments can best be understood when read in conjunction with the following drawings, wherein.

DETAILED DESCRIPTION OF THE PREFERRED EMBODIMENTS

Figure 1:
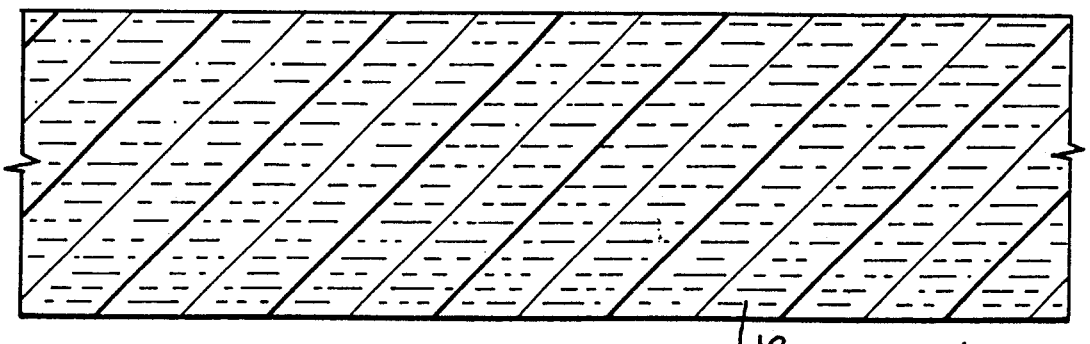
FIG. 1 shows in cross-section an unhardened adhesive according to a first embodiment of the present invention.

Referring now to FIG. 1, in accordance with a first embodiment of the present invention, the thermally and electrically conductive adhesive material of the present invention is prepared by providing an unhardened adhesive which can be rendered harder, such as thermoplastic materials (hardenable by lowering the temperature), thermosetting and ultra-violet curing materials, two-part epoxies, and silcone gels (each hardenable by chemical reaction), and solvent-bearing materials (hardenable by loss of solvent). In this embodiment, a liquid epoxy 12 is used.

Figure 2:
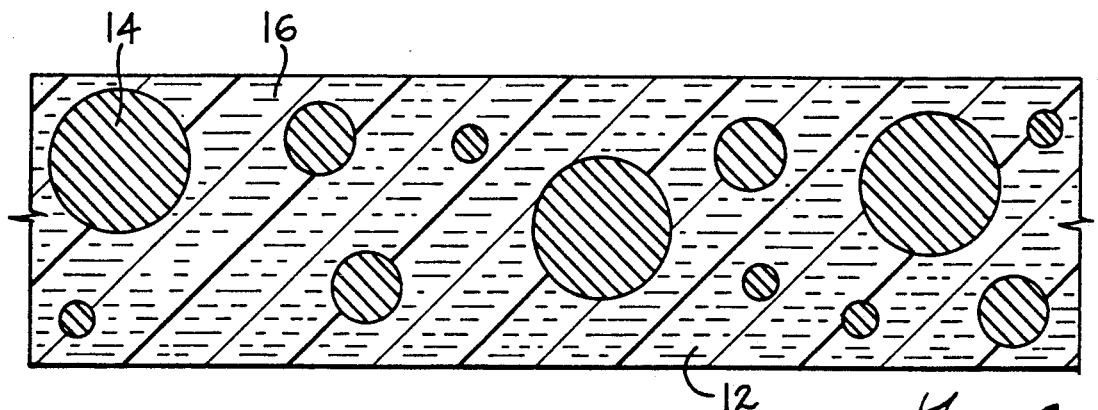
FIG. 2 shows the unhardened adhesive of FIG. 1 mixed with a filler containing a liquid metal.

Referring now to FIG. 2, a filler containing a liquid metal is provided, and is dispersed into the unhardened adhesive. For example, liquid gallium 14 is mixed into liquid epoxy 12. Liquid metal is the key component of the adhesive material of the present invention due to its excellent thermal and electrical conductivity as well as its liquidity. As used herein, the term "liquid metal" is defined as being gallium, mercury, or a compound containing gallium or mercury. That is, the "liquid metals" of the present invention are a class of materials which remain so named even if cooled and solidified. Liquid metals and liquid metal compounds suitable for the present invention, by way of example and not limitation, are set forth in TABLE 1 below.

TABLE I

| Liquid Metals (Melting Point) |
| --- |
| Gallium (30° C.) |
| Gallium/Tin (16° C.) |
| Gallium/Indium (15° C.) |
| Gallium/Indium/Tin (5° C.) |
| Any of the above with Mercury, Cadmium, and Bismuth |
| Mercury (−39° C.) |
| Mercury/Zinc (−41.6° C.) |

Numerous liquid metal bearing materials and combinations of materials are well suited as the filler of the present invention. For instance, the filler may consist of or consist essentially of the liquid metal. The filler can be a liquid metal or a liquid metal alloy. Preferred liquid metal alloys comprise gallium with one or more of tin, bismuth and cadmium. The filler may also be a non-solidifying liquid metal paste comprising liquid metal and solid particulate constituents as described by Thomas P. Dolbear et al. in U.S. Pat. Nos. 5,056,706 and 5,170,930 which are incorporated herein by reference. Preferably, the non-solidifying paste comprises an equilibrium mixture of the liquid metal and particulate solid constituents wherein at the temperature of the paste during connection to external surfaces, as shall be described below, the proportions of liquid metal and particulate solid constituents remain between the ultimate liquidus and the ultimate solidus of the phase diagram of the mixture and the paste remains non-solidified. The filler may also be a paste which reacts to form an amalgam and solidifies, as described by Colin A. MacKay in U.S. Pat. No. 5,053,195 and U.S. Ser. No. 07/701,543 filed May 16, 1991 which are incorporated herein by reference.

It should also be noted that the filler may be mixed into the unhardened adhesive as a liquid or as solid particles.

Liquid metal and liquid metal pastes are the preferred fillers of the present invention. As non-solidified fillers, they have numerous advantageous characteristics: 1) no plastic deformation or fatigue, 2) low elastic modulus, 3) physical compliance and the ability to maintain contact across surfaces despite local deformations occurring due to different coefficients of thermal expansion of the surfaces being bonded or "adhesive creep", 4) low melting point allowing assembly of temperature sensitive components, 5) usable with a wide variety of adhesives, and 6) high electrical conductivity. Liquid pastes also have higher thermal conductivity than solder-based fillers.

Figure 19:
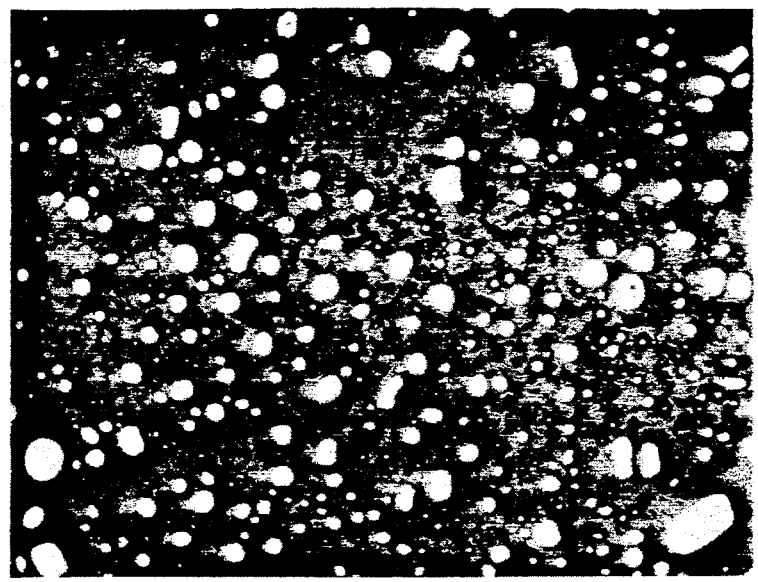
FIG. 19 is a photomicrograph of the interface side of a transparent surface bonded to the adhesive material of the present invention.
Figure 20:
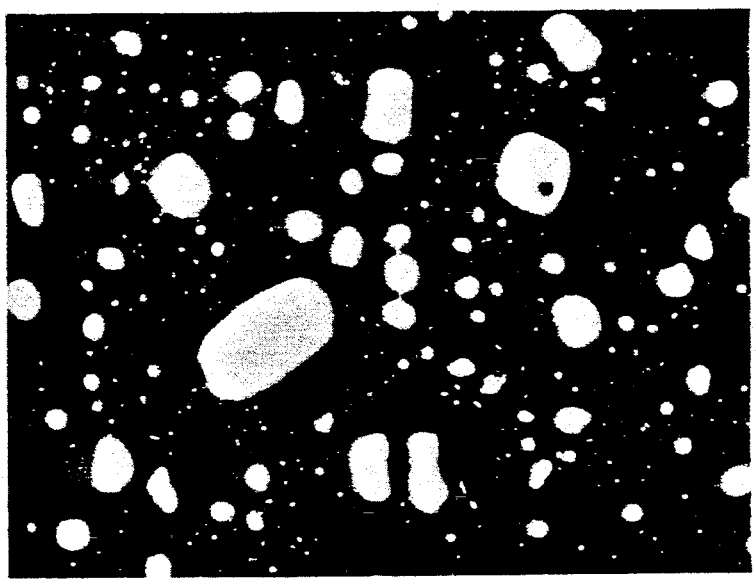
FIG. 20 is a photomicrograph similar to FIG. 19 at higher magnification.

Gallium is the preferred liquid metal. Gallium has outstanding ability (comparable with germanium) to wet a host of materials. These materials include ceramics such as alumina and aluminum nitride, glasses (as shown in FIGS. 19-20) and metals. Moreover, gallium wets materials which oxidize including copper, tungsten, molybdenum and tantalum. This is due to the fact that gallium oxide present on liquid gallium tends to enhance wetability. This is unlike solder compositions which are inhibited by oxides on the solder or surfaces being joined and which fail to wet ceramics lacking appropriate metallizations. Thus, gallium based fillers have unique properties over and above conventional solders. The elimination of fluxes is also environmentally appealing as the handling of related by-products is avoided. As with solders, however, gallium does not wet all materials and is not compatible with certain materials such as aluminum. In some instances appropriate surface coatings or preparations are needed for gallium, as further described below.

Mercury, unfortunately, has a low vapor pressure which may be problematic in certain applications.

Referring still to FIG. 2, surface tension differences between liquid epoxy 12 and liquid gallium 14 result in an adhesive matrix mixture 16 with a fine dispersion of sphere-like regions of gallium 14 approximately 1–80 mils in diameter. Preferably, liquid gallium 14 is in the range of 20% to 70% of mixture 16 by volume and liquid epoxy 12 is sufficiently viscous to prevent the spheres of gallium 14 from coalescing or separating. A sufficiently viscous epoxy may be obtained by partially curing the epoxy prior to dispersing the liquid gallium therein. Finally, gallium 14 is in liquid state during mixing for illustration purposes only; solid particles of gallium 14 can also occupy the preferred range of 20% to 70% of the mixture by volume.

Figure 3:
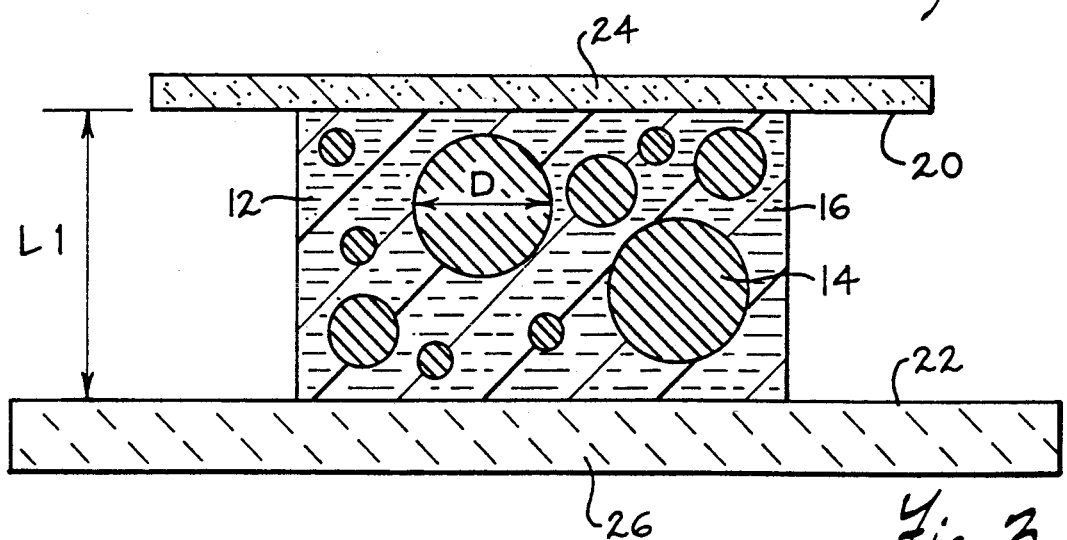
FIG. 3 shows the mixture of FIG. 2 disposed between a pair of surfaces.

Referring now to FIG. 3, the unhardened adhesive is placed in contact with the surfaces to be bonded. As may be seen, mixture 16 of liquid epoxy 12 and gallium 14 is disposed between a pair of opposing top major surfaces 20 and 22 of integrated circuit chip 24 and electrical interconnect substrate 26, respectively. Mixture 16 could initially be applied to surface 20, surface 22, or both. It is noted that surfaces 20 and 22 are separated by a length L1 greater than characteristic distance D of the substantially spherical gallium regions. In addition, while some mixtures produce spheres of filler, others may produce more general and random shapes of filler, especially if the liquid adhesive is highly viscous.

Figure 4:
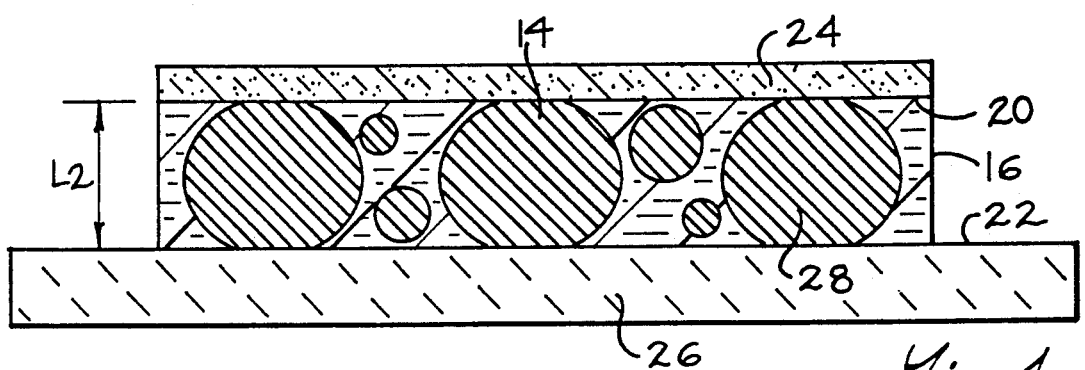
FIG. 4 shows the assembly of FIG. 3 with the surfaces brought closer together so that separate spaced regions of non-solidified filler form continuous paths between the surfaces.

Referring now to FIG. 4, separate spaced regions of the dispersed filler in a non-solidified state must now be brought in contact with (and preferably wet) the surfaces without contacting any other of such filler regions. In this embodiment, surfaces 20 and 22 are brought closer together until separated by a length L2 less than or equal to (preferably slightly less than) distance D. This smears mixture 16 across the surfaces and forms regions 28 of gallium 14. Regions 28 are separate from one another and provide a continuous path of gallium 14 between and in contact with surfaces 20 and 22. Gallium 14 must be in liquid state at least temporarily during contact with surfaces 20 and 22 to make proper electrical and thermal contact. Preferably, gallium 14 wets surfaces 20 and 22 thereby enhancing the contact. In addition, gallium 14 must be compatible with (not attack) surfaces 20 and 22. Finally, it is noted that after contacting surfaces 20 and 22 it is no longer essential that gallium 14 remain non-solidified.

Figure 5:
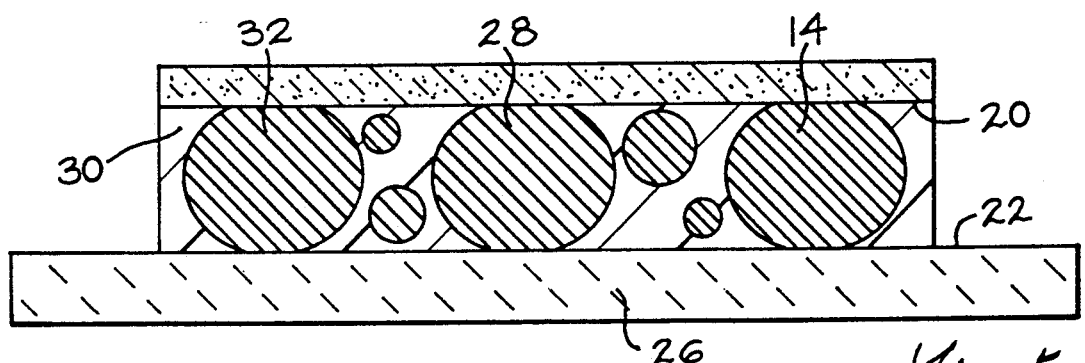
FIG. 5 shows the assembly of FIG. 4 after the unhardened adhesive is rendered harder and forms a mechanical bond between the surfaces wherein the filler in the regions forms continuous thermally and electrically conductive paths between the surfaces.

Referring now to FIG. 5, the unhardened adhesive is transformed into a harder adhesive which provides a mechanical bond between the surfaces wherein the filler in each region provides a separate continuous thermally and electrically conductive path between and in contact with the surfaces. The applicable transformation process depends on the particular adhesive, as previously discussed. For illustration purposes, liquid epoxy 12 is cured to form a solid epoxy 30 wherein the gallium 14 in regions 28 forms separate, spaced metal bridges 32 between and in contact with surfaces 20 and 22. Epoxy 30 yields a secure mechanical bond as is preferred. Bridges 32 are thin metal joints with relatively wide contact areas, providing highly conductive thermal and electrical paths between surfaces 20 and 22. As such, bridges 32 are thermally superior to the limited metal contact provided by prior art adhesives containing solid particle fillers such as silver filled epoxies.

The harder adhesive may be solid, but need not necessarily be. For instance, thermoplastic materials typically provide high strength bonds. However, the harder adhesive could be stiffened, thickened or highly viscous and the like, without being solid or secure, as long as some mechanical bonding of the surfaces occurs. Silicone gel, in particular, will polymerize and cross-link, but to a lesser extent than many other adhesives, and thus provides a relatively weak mechanical bond. In certain applications the weaker adhesives may require additional support to maintain a reliable mechanical bond during vibration or whatever other loading which may occur during operation.

If the filler is to be solidified, this may occur before, during, or after the harder adhesive is formed. The filler can also be solidified dependently or independently of forming the harder adhesive. The choice depends on the filler employed, the transformation process, the intended use of the filler and so on. The filler need only be non-solidified at some time when the separate spaced regions of filler are in contact with the surfaces, as described above and shown in FIG. 4, in order to assure a wider area contact with the surfaces than would be possible if the filler were solid.

One approach to solidifying the filler is by temperature decrease. For instance, liquid metal or liquid metal paste fillers remain non-solidified regardless of the adhesive hardening process unless the temperature falls below a characteristic melting point. Furthermore, a solidified (cooled) liquid metal, liquid metal paste, or low temperature solder may again be rendered non-solidified by temperature increase, for instance by operating the bonded components, or by providing an external heat source. On each cycle, or every melting, the filler will recover whatever plastic damage occurred when it was solid thereby eliminating fatigue. In addition, the remelted filler facilitates shearing the bond during a rework or disassembly operation.

The filler can also be solidified by amalgamation. Amalgam paste fillers solidify with time regardless of the adhesive hardening process, although applying heat or ultraviolet energy may increase the rate at which the amalgam solidifies. One such amalgam paste is a mixture of gallium, copper and nickel. A Ga/Cu/Ni paste will, with time, amalgamate and form a solid bond. If the Ga/Cu/Ni paste, while still viscous, is dispersed in epoxy, then the elevated temperature cycle used to cure the epoxy would also accelerate the solidification of the Ga/Cu/Ni paste. Advantageously, certain amalgams expand slightly during solidification, whereas certain epoxies shrink, especially during cooling. Under these conditions, thermal bridges 32 form in a state of compressive pre-load at room temperature in which a constant pressure against the surfaces assures that good thermal and electrical contact is retained between the bonded surfaces. It should also be noted that the adhesive is far more likely to harden before the amalgam filler hardens. Amalgam fillers have advantages over solder-based fillers, including higher melting points, less susceptibility to fatigue, and the ability to utilize the excellent wetting capability of gallium. Amalgams also eliminate possible long-term corrosive action which may occur with liquid metals and liquid metal pastes.

Figure 6:
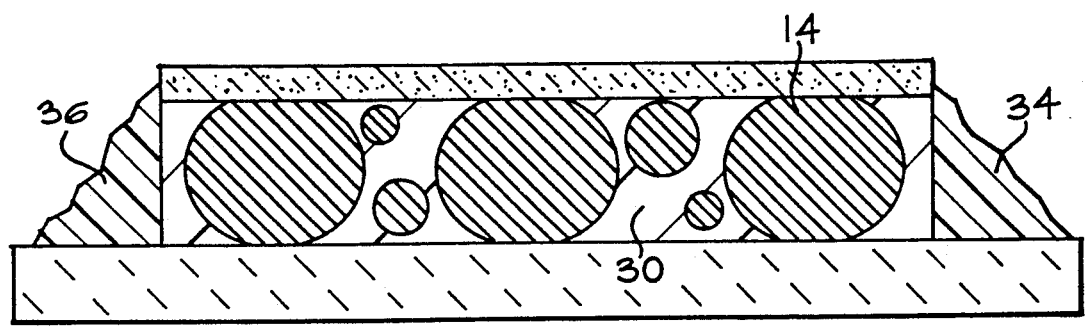
FIG. 6 shows the assembly of FIG. 5 further including an optional encapsulant surrounding the bond.

Referring now to FIG. 6, an optional encapsulant is shown surrounding the edges of the harder adhesive to provide further containment. The encapsulant should be chosen both for its compatibility with harder adhesive and its ability to exclude moisture. The encapsulant can be applied either before, during or after the harder adhesive is formed. In the present embodiment, 5-20 mils of a silicone gel 34, like Dow Corning HIPEC 6646 which is used in various packaging applications, serves as the encapsulant. Gel 34 could be a non-filled region of liquid epoxy 12 which is made harder simultaneously with curing liquid epoxy 12 into solid epoxy 30. It should be noted that without the encapsulant, the harder adhesive encloses and retains most or all of any non-solidified filler and thus minimizes or eliminates leakage as compared to liquid metals, pastes, or thermal greases. The degree of containment and/or need for encapsulation depends on materials selection, the amount of filler, the sensitivity of nearby components, etc. For instance, epoxy 30 normally provides complete containment for gallium 14. Yet silicone gel 34 provides still greater containment against diffusion of liquid gallium into undesired locations. Of course, the use of a solidified filler during operation eliminates containment problems. Therefore, the encapsulant is not considered an essential aspect of the present invention but may be preferred when it is critical to contain a non-solidified filler.

Referring now to FIGS. 7-10, there is seen another embodiment of the present invention wherein like parts similar to those previously discussed are similarly numbered. In this embodiment, the unhardened adhesive is a flexible adhesive film and the filler is dispersed by forming vias in the film and depositing the non-solidified filler into the vias.

Figure 7:
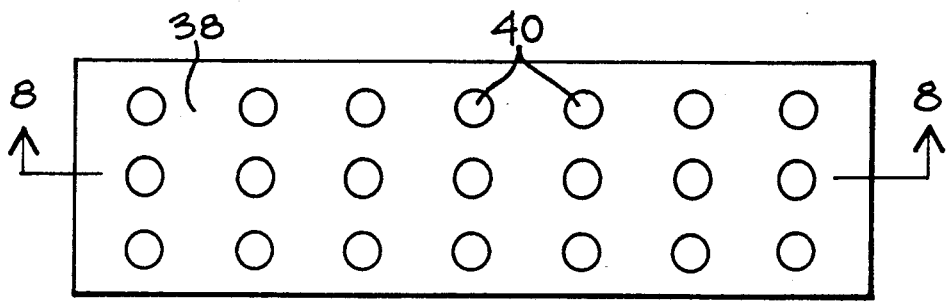
FIG. 7 shows a top plan view of a flexible adhesive film with patterned vias according to another embodiment of the present invention.

Referring now to FIG. 7, there is shown a top plan view of a flexible adhesive film with a patterned matrix of vias. Flexible adhesive film may be a solid (but unhardened) film such as a thermoplastic, or B-staged film such as a partially cured thermosetting material. For illustration purposes a partially cured thermosetting film 38 is depicted. Separate, spaced through-holes or vias 40 are formed between the top and bottom surfaces of film 38 by any conventional means including laser drilling and screening.

Figure 8:
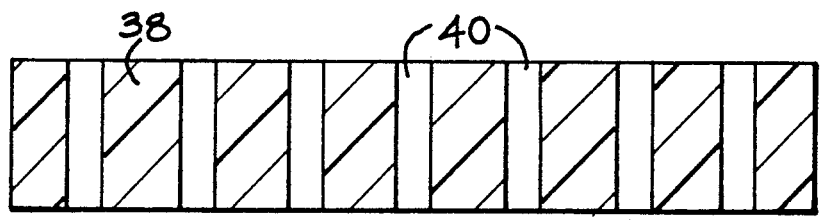
FIG. 8 shows a cross-sectional view of the film taken along line 8—8 of FIG. 7.

Referring now to FIG. 8, there is shown a cross-sectional view of film 38 taken along line 8—8 of FIG. 7. As may be seen, vias 40 extend vertically between the planar top and bottom film surfaces of film 38. Film 38 is 1-30 mils thick, vias 40 are 1-3 mils in diameter.

Figure 9:
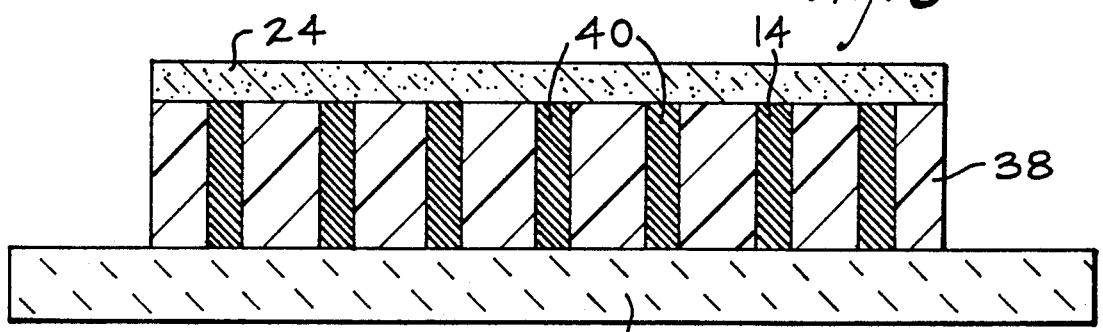
FIG. 9 shows the film of FIG. 8 with filler in the vias and disposed between a pair of surfaces.

Referring now to FIG. 9, the filler is deposited into the vias and the film and filler are placed in contact with a pair of surfaces. As shown, film 38 is disposed on electrical interconnect substrate 26 and liquid gallium 14 is deposited such as by squeegeeing into vias 40. Thereafter, integrated circuit chip 24 is disposed on film 38.

Figure 10:
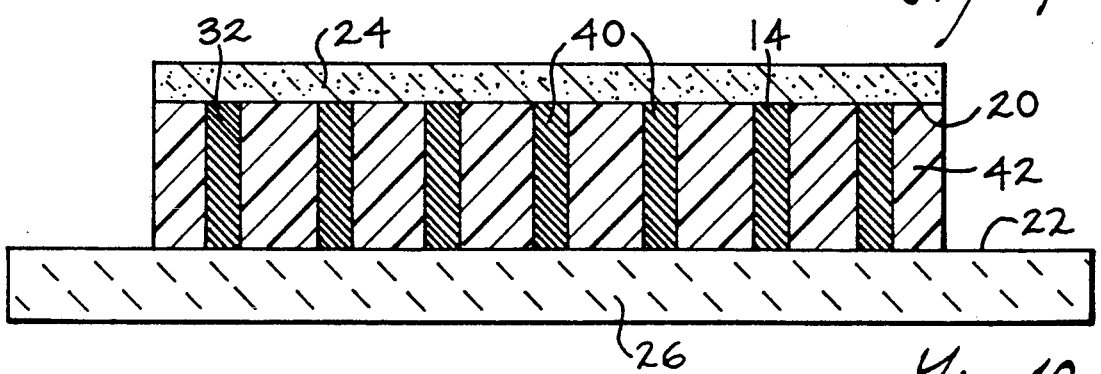
FIG. 10 shows the assembly of FIG. 9 after hardening the film to form a mechanical bond between the surfaces with the filler in the vias forming continuous thermally and electrically conductive paths between the surfaces.

Referring now to FIG. 10, film is transformed into a harder film. In this embodiment, film 38 is cured to form hardened film 42 (darker shade) which provides a solid mechanical bond between the surfaces 20 and 22. As is seen, the gallium 14 in vias 40 provides continuous thermally and electrically conductive paths or bridges 32 between the surfaces 20 and 22.

Figure 11:
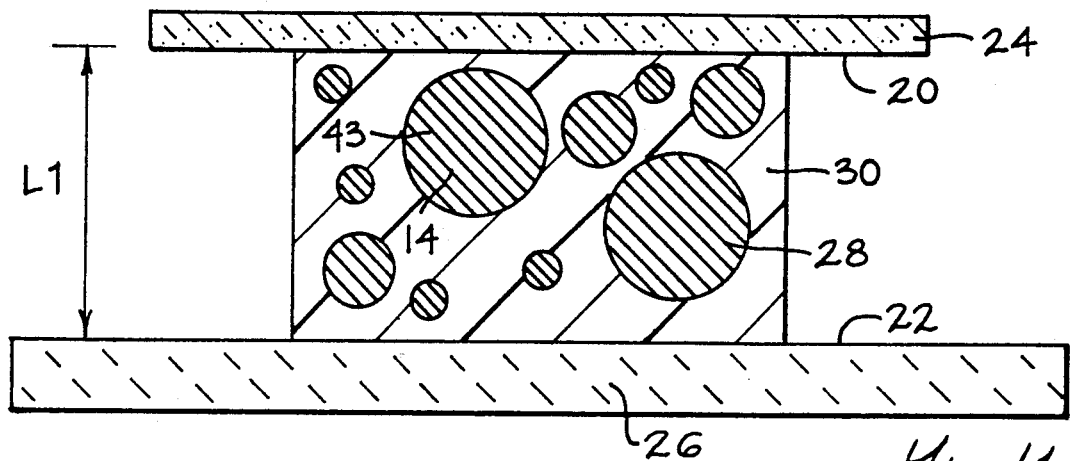
FIG. 11 shows an assembly similar to FIG. 3 in which the unhardened adhesive is rendered harder without bringing the surfaces closer together so that filler provides thermal conduction without continuous paths for electrical conduction between the surfaces.
Figure 12:
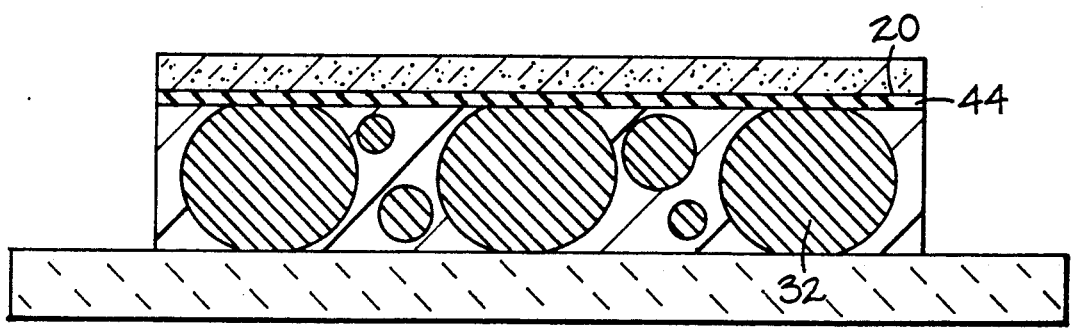
FIG. 12 shows an assembly similar to FIG. 5 with a thin electrically insulative layer over a surface so that the filler provides thermal but not electrical conduction between the surfaces.
Figure 15:
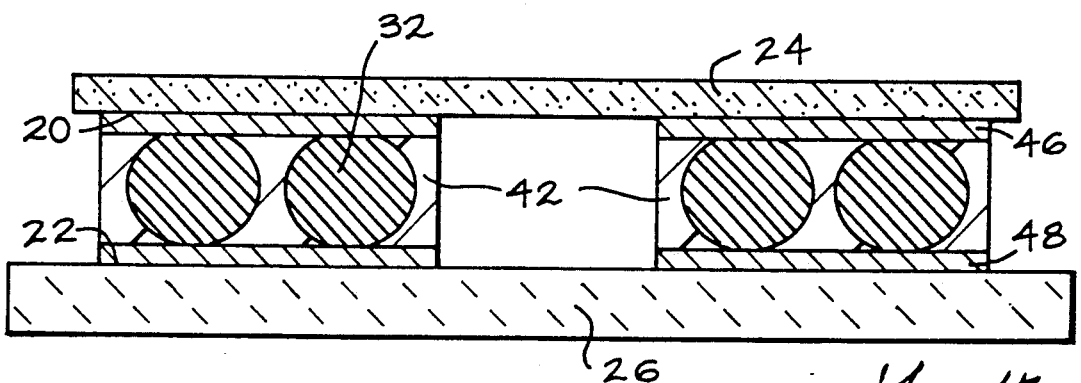
FIG. 15 shows an assembly similar to FIG. 13 with the filler selectively dispersed between the matching pairs of pads.
Figure 16:
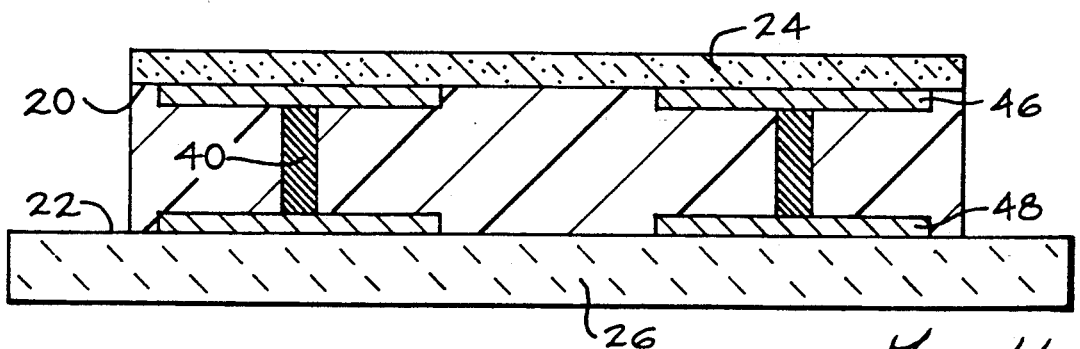
FIG. 16 shows an assembly similar to FIG. 10 with matching pairs of pads on the bonded surfaces connected by filler disposed in vias directly between the pads.
Figure 17:
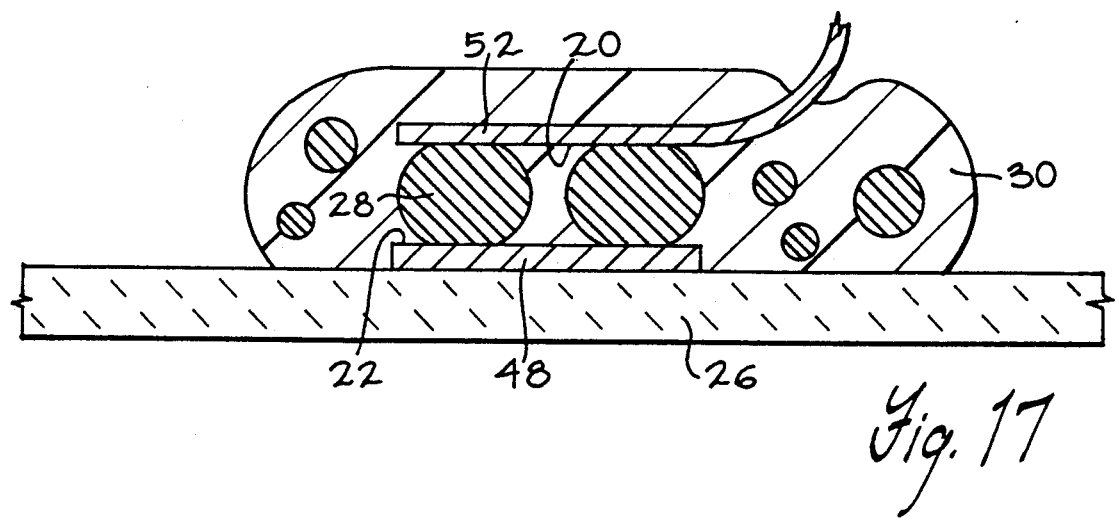
FIG. 17 shows an assembly similar to FIG. 5 wherein the filler surrounds an outer lead end and connects the outer lead end to a bonding pad.
Figure 18:
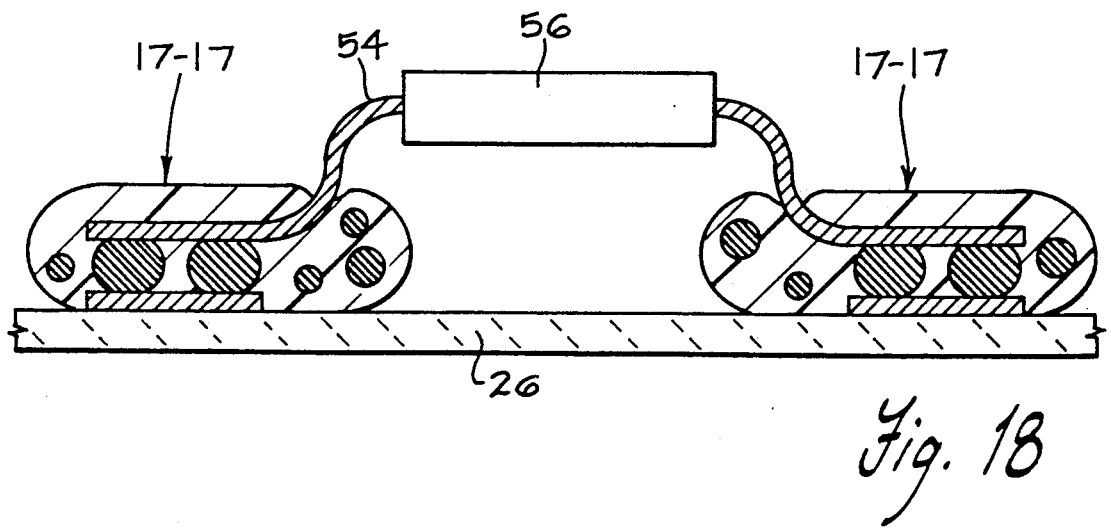
FIG. 18 shows a plurality of the assembies of FIG. 17 for surface mounting an electronic component on a substrate.

In the embodiments shown in FIGS. 11-18, like parts similar to those previously discussed are similarly numbered and the descriptions need not be repeated. FIGS. 11-12 illustrate the use of the adhesive material of the present invention as a die attach between a chip and substrate 26 keeping the chip and substrate electrically isolated from one another. FIGS. 13-16 illustrate using the adhesive material to provide anisotropic electrical connections between matching pairs of pads on a chip and a substrate. FIGS. 17-18 illustrate using the adhesive material to connect an outer lead end to a bonding pad for surface mounting an electronic component on a substrate.

Referring now to FIG. 11, the surfaces are electrically isolated by omitting the step (shown in FIG. 4) of bringing the surfaces 20 and 22 closer together. That is, surfaces 20 and 22 are still separated by length L1 when liquid epoxy 12 is hardened into solid epoxy 30. This prevents the filler regions 28 from contacting both surfaces. Thus, no continuous conductive bridges 32 between surfaces 20 and 22 are formed. While discontinuous regions 43 of gallium 14 fail to provide continuous electrical paths between the surfaces, regions 43 do increase the thermal conductivity between the surfaces.

Referring now to FIG. 12, the surfaces are electrically isolated by coating surface 20 with a thin insulating layer 44 such as 0.1 to 10 mils of nitride passivation or a diamond film. Insulating layer 44 is thin enough to electrically disconnect surface 20 from bridges 32 without substantially decreasing the thermal conductivity between surface 20 and bridges 32.

Figure 13:
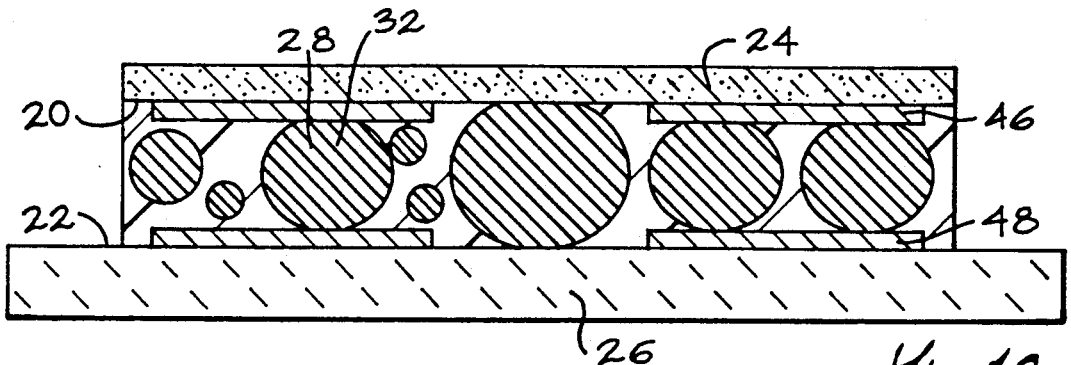
FIG. 13 shows an assembly similar to FIG. 5 with matching pairs of pads on the bonded surfaces connected by filler randomly dispersed across the surfaces.

Referring now to FIG. 13, the adhesive bonding material is spread across the surfaces and randomly dispersed filler regions form anisotropic electrical connections between electrical pads on the bonded surfaces. Surface 20 comprises electrical bonding pads 46; surface 22 comprises electrical bonding pads 48. Pads 46 are in one-to-one correspondence with, and preferably are mirror representations of, pads 48. Upon vertically aligning chip 24 and substrate 26, pads 46 correspond in one-to-one relationship with pads 48 to form matching pairs of pads. That is, a single pad 46 lies directly above each pad 48 and vice versa. This method of attachment between electrical components is commonly referred to as "flip chip" bonding. Even though filler regions 28 are randomly distributed across surfaces 20 and 22, they are small enough yet packed densely enough with respect to pads 46 and 48 to assure that each matching pair of pads is interconnected by at least one metal bridge 32 without any non-matching pads being connected or bridged. In addition, the low viscosity of mixture 16 permits low assembly pressure which facilitates the flip chip assembly operation.

Figure 14:
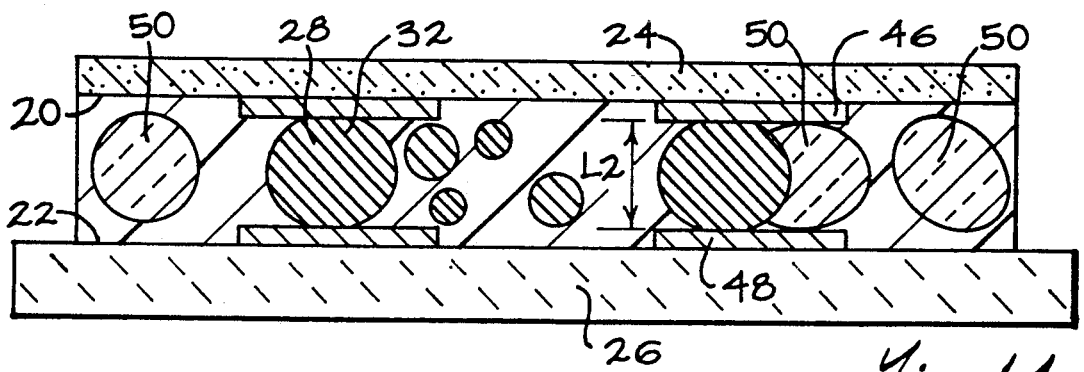
FIG. 14 shows an assembly similar to FIG. 13 further including spacer particles in the adhesive material to assure a minimum distance between the surfaces.

Referring now to FIG. 14, solid spacer particles are included in the adhesive bonding material of the present invention in order to assure a minimum distance or spacing between the bonded surfaces. For example, glass beads 50 assure that surfaces 20 and 22 are spaced at least a distance L2 from one another. By preventing surfaces 20 and 22 from getting too close, the non-solidified filler is also prevented from spreading so far out laterally that it might connect non-matching pads. The spacer particles are particularly useful when dealing with small pad spacings and need not necessarily be identically sized.

Referring now to FIG. 15, the adhesive bonding material is selectively deposited between the electrical pads on the bonded surfaces. In this embodiment the filler is confined to the area between (and perhaps in the immediate vicinity of) the pads. The area between surfaces 20 and 22 outside pads 46 and 48 is left as open space unless otherwise filled. Therefore, a relatively small amount of adhesive bonding material will suffice. In addition, glass beads 50 are unnecessary since the filler regions may properly coalesce. However, in comparison to the embodiment of FIG. 13 the overall thermal conductivity between surfaces 20 and 22 is decreased since bridges 32 no longer exist outside the pads. Likewise, the presence of the harder adhesive between the pads decreases the thermal conductivity as compared to disposing solely filler between the pads.

Referring now to FIG. 16, filler regions disposed in predetermined vias form anisotropic electrical connections between electrical pads on bonded surfaces. As may be seen, vias 40 are positioned in one-to-one correspondence directly between each matching pair of pads 46 and 48. While a single gallium-filled via 40 is shown for each matching pair of pads, it should be noted that a plurality of smaller vias could connect each pair of pads. Furthermore, it is not mandatory that the vias be removed between non-matching pads. Since the vias are separate and spaced anisotropic conductors, a plurality of vias (not shown) can be positioned in contact with surfaces 20 and 22 outside pads 46 and 48 to provide additional thermally conductive paths between chip 24 and substrate 26 without connecting any non-matching pads.

Referring now to FIG. 17, the adhesive material of the present invention is shown as surrounding an outer lead end and connecting the outer lead end to a bonding pad. In this example, the upper surface 20 is provided by outer lead end 52 of lead 54, and lower surface 22 is provided by bonding pad 48 on substrate 26. Outer lead end 52 and bonding pad 48 are connected by a bond containing filler regions 28 and solid epoxy 30. Filler regions 28 are seen as thermally and electrically connecting lead end 52 to the underlying bond pad 48. In addition, solid epoxy 30 surrounds outer lead end 52 thereby enhancing the mechanical connection between the lead end and the pad.

Referring now to FIG. 18, a plurality of the assembies of FIG. 17 are used for surface mounting an electronic component on a substrate. As may be seen, electrical component 56 comprises a plurality of outwardly extending leads 54. At the bonds, outer lead ends 52 are surrounded as well as connected to a plurality of bonding pads 48 in one-to-one relationship. That is, each lead is bonded and connected to a separate bonding pad. One such connection is shown in detail 17—17, the expanded view being FIG. 17. Returning to FIG. 18, this form of attachment is commonly referred to as "surface mounting." Surface mount attachment is applicable to a wide variety of electronic components and substrates. Rigid or flexible circuit attachment are two examples. It is further noted that, in the present illustration, the entire mechanical, electrical and thermal connection between component 56 and substrate 26 must include outer lead ends 52 as well as the bonds. While the entire electrical connection must include pads 48, the thermal and mechanical connections may include not only pads 48 but substrate 26 outside the pads as well. Nevertheless, filler regions 28 provide thermal and electrical connections between outer lead ends 52 and pads 48, solid epoxy 30 provides mechanical attachment between outer lead ends 52 and pads 48, and the remainder of component 56 is separated from and spaced above substrate 26. Component 56 may be attached to substrate 26 by 1) disposing mixture 16 of liquid epoxy 12 and liquid gallium 14 on pads 48, 2) inserting the outer lead ends 52 into mixture 16 on pads 48 such that filler regions 28 contact outer lead ends 52 and pads 48, and then 3) transforming liquid epoxy 12 into solid epoxy 30.

The inclusion of a liquid metal component in the present invention adhesive makes the preferred applications those where the joined surfaces are not subject to attack by the liquid metal itself. For instance, in the event the liquid metal is gallium then aluminum and copper surfaces would require surface coatings or preparations to allow a reliable interface to be maintained. Aluminum and gallium react to cause aluminum embrittlement. Furthermore, gallium at a bare aluminum surface tends to migrate along the grain boundaries of the aluminum. Within a short time a vast majority of the gallium may migrate from the interface which would degrade the thermal performance of the adhesive. Copper and gallium react to form various compounds. Over time the liquid gallium at the interface may be consumed by these reactions.

In order to avoid these problems, the aluminum and copper can be passivated by coating with an appropriate material such as by electroplating, chemical vapor deposition, explosive forming, roll bonding, and so on. Aluminum (but not copper) can be protected by anodization and aluminum nitride. Both Aluminum and copper can be protected by thermal spray of alumina, nickel plating, nickel plating and subsequent heat treatment to form nickel compounds, chemical vapor deposition of tungsten, and cladding with tungsten, tantalum or molybdenum. Aluminum and copper can also be protected coating a metal which yields a refractory oxide and then oxidizing the metal to form a continuous refractory oxide layer. Suitable metals that can form a refractory oxide include nickel, chromium, titanium, tantalum, yttrium, scandium, zirconium and niobium.

It is possible that, under proper conditions, a coating which reacts with the liquid metal may become a more effective barrier by reducing or closing the pinholes in itself. By way of example, a copper coating on an aluminum surface may react with gallium to close pinholes in the copper thereby decreasing the risk of gallium contacting the aluminum and causing aluminum embrittlement.

The appropriate coating must be conductive or resistive depending on whether the coated surface is to be electrically connected to or electrically isolated from the liquid metal, respectively. For example, aluminum and copper can be protected and electrically insulated from the gallium with alumina or a sufficiently thick continuous refractory oxide layer.

In the event the filler 14 is a paste, the preferred approach is to coat the aluminum or copper with the same material that is the particulate solid constituent of the paste, such as tungsten, in order to inhibit dissolution of the protective coating into the paste, although for most coatings the dissolution is slow or the coating inhibits diffusion into the bulk material.

The following non-limiting examples are provided to further illustrate the present invention. These examples are meant to illustrate and not to limit the invention, the scope of which is defined solely by the appended claims.

EXAMPLE 1

Applicant has reduced the invention to practice by stirring a batch of two-part Devcon 5-minute liquid epoxy resin with liquid gallium. The liquid gallium was dispersed in substantially spherical regions approximately 1-20 mils in diameter and occupied 50% of the mixture by volume. (Although not investigated, allowing the liquid gallium to occupy 20% to 70% of the mixture by volume was considered acceptable.) The epoxy was given 30 minutes to harden at room temperature. The hardened material was examined qualitatively for its appearance, hardness and electrical conductivity. Each sample was found acceptable. No substantial visual changes were noted after one year.

EXAMPLE 2

Similar to Example 1 except the mixture was used to bond glass slides together and the one year period between forming and inspecting the bond was omitted. After mixing and forming a dispersion of very tiny gallium droplets within the liquid adhesive, a dollop of the gallium/adhesive was placed on the surface of a glass slide. Another glass slide, smaller than the first, was pressed against the adhesive on the larger glass slide, forcing adhesive to flow from between the two glass surfaces leaving a very thin bond of approximately 2 mils thick. This process was performed with the gallium filler in a liquid state. Thereafter the Devcon epoxy was cured by chemical reaction of the two-part adhesive mixture. FIG. 19 is a photomicrograph showing 100× magnification of the interface between the adhesive bonding material and a glass slide as seen through the slide. The liquid gallium is seen as lightly shaded regions; the epoxy appears dark. As may be seen, the liquid gallium bridged across the cured adhesive bondline and wet the glass. FIG. 20 is the same at 200× magnification.

EXAMPLE 3

Similar to Example 2 except liquid gallium was mechanically mixed into two different UV curable adhesives—Locite 366 and Borden 284-183-1. Each of these adhesives was liquid until exposed to UV light for curing. The amount of gallium was weighed to be approximately 20% by volume. Glass beads approximately 45 microns in diameter were then mixed into some but not all of the adhesives. After mixing and forming a dispersion of very tiny gallium droplets within the liquid adhesive, the mixtures were placed between glass slides and pressure was applied with the gallium filler in a liquid state. Subsequently, these assemblies were exposed to UV light for 60 seconds to fully cure the material bonding the glass slides to one another. After bonding, visual inspection clearly showed that liquid metal regions bridged across the cured adhesive bondline wetting the glass on each side. This was apparent since the same filler dispersion pattern was visible when viewing from each side of the bond. It was also clear that the glass beads limited the contact area of the liquid metal regions.

EXAMPLE 4

Two copper blocks were attached with the Devcon 5 minute epoxy containing a liquid gallium filler. The amount of gallium was weighed to be approximately 20% by volume of the bond. For comparison, two other copper blocks were also attached with the Devcon 5 minute epoxy only. Both samples were prepared by pressing the respective copper blocks together to form the thinnest bondline acheivable. The unfilled and filled attachments were approximately 1-2 mils thick. The thermal resistance of each sample was then measured using the test method described by Thomas P. Dolbear in "Liquid Metal Paste for Thermal Connections", *Proceedings of the International Electronic Packaging Society* (IEPS), September 1992, pp. 475–485. The thermal resistance for the attachment with the unfilled epoxy was 0.75° C.-sqcm/W whereas the thermal resistance of the attachment using the liquid gallium filled epoxy was 0.11° C.-sqcm/W. Thus, the liquid metal filler substantially reduced the thermal resistance of the attachment. Moreover, the thermal resistance of the liquid metal filled attachment was both lower and less sensitive to bondline thickness than that obtainable with conventional solid filled adhesive attachments.

While the present invention is described primarily in terms of a thermally and/or electrically conductive attachment between a chip and a substrate, it will be understood that the invention has more general utility with respect to other types of heat sink attachment, electrical attachment, adhesive "flip-chip" bonding, and multi-chip module implementation.

The present invention, therefore, is well adapted to carry out the objects and attain the ends and advantages mentioned, as well as others inherent therein. While presently preferred embodiments of the present invention have been described for the purpose of disclosure, numerous other changes in the details of construction, arrangement of parts, compositions and materials selection, and processing steps can be carried out without departing from the spirit of the present invention which is intended to be limited only by the scope of the appended claims.

What is claimed is:

1. A method of bonding two surfaces with a thermally and electrically conductive adhesive material, comprising the steps of:
   (a) providing an unhardened adhesive;
   (b) providing a filler containing a liquid metal;
   (c) randomly dispersing the filler into the unhardened adhesive;
   (d) contacting the unhardened adhesive to the surfaces;
   (e) contacting separate spaced regions of the dispersed filler in non-solidified state to the surfaces before the completion of step (f), each of said regions contacting both surfaces without contacting other of said regions; and
   (f) transforming the unhardened adhesive into a harder adhesive which provides a mechanical bond between the surfaces wherein the filler in each region provides a separate continuous thermally and electrically conductive path between and in contact with the surfaces.

2. The method of claim 1 wherein the filler consists essentially of the liquid metal.

3. The method of claim 1 wherein the filler is the liquid metal.

4. The method of claim 1 wherein the liquid metal is selected from the group consisting of gallium, gallium-/indium, gallium/indium/tin and mercury.

5. The method of claim 1 wherein the filler is a liquid metal paste comprising the liquid metal and particulate solid constituents.

6. The method of claim 5 wherein the paste comprises an equilibrium mixture of the liquid metal and the particulate solid constituents wherein at the temperature of the paste during the contacting step (e) the proportions of the liquid metal and the particulate solid constituents remain between the ultimate liquidus and the ultimate solidus of the phase diagram of the mixture and the paste remains non-solidified.

7. The method of claim 1 wherein the filler is a liquid metal alloy comprising two or more of gallium, tin, bismuth and cadmium.

8. The method of claim 1 wherein the filler is gallium.

9. The method of claim 1 wherein after the contacting step (e) the non-solidified filler reacts to form an amalgam and solidifies.

10. The method of claim 9, wherein
said paths are metal bridges;
during the transforming step (f) the harder adhesive forms a solid and contracts; and
after the transforming step (f) the amalgam solidifies and expands, thereby providing pressure between the metal bridges and the surfaces.

11. The method of claim 1 wherein during the contacting step (e) the non-solidified filler wets at least one of the surfaces.

12. The method of claim 1 wherein the transforming step (f) solidifies the filler.

13. The method of claim 1 wherein the transforming step (f) does not solidify the filler.

14. The method of claim 13, further comprising lowering the temperature of the filler after the transforming step (f) so as to solidify the filler.

15. The method of claim 14, further comprising raising the temperature of the solidified filler after said lowering the temperature of the filler so as to non-solidify the filler.

16. The method of claim 1 wherein the filler is non-solidified in step (b).

17. The method of claim 1 wherein the filler is non-solidified in steps (b) through (d).

18. The method of claim 1 wherein the filler is non-solidified in steps (b) through (f).

19. The method of claim 1 wherein the filler is solidified in steps (b) through (d).

20. The method of claim 19 wherein the filler is non-solidified in steps (e) through (f).

21. The method of claim 1 wherein the unhardened adhesive is selected from the group consisting of thermoplastic materials, thermosetting materials, ultraviolet curable materials, epoxies, silicone gels and solvent-bearing materials.

22. The method of claim 1 wherein the unhardened adhesive is an epoxy which is transformed into the harder adhesive by chemical reaction.

23. The method of claim 1 wherein the unhardened adhesive is a silicone gel which is transformed into the harder adhesive by chemical reaction.

24. The method of claim 1 wherein the unhardened adhesive contains a solvent and is transformed into the harder adhesive by loss of the solvent.

25. The method of claim 1 wherein the unhardened adhesive is a liquid and the dispersing step (c) includes mixing solidified filler into the liquid adhesive.

26. The method of claim 25 wherein the solidified filler is in the range of 20% to 70% of the mixture by volume.

27. A method of bonding two surfaces with a thermally and electrically conductive adhesive material, comprising the steps of:
(a) providing a liquid adhesive;
(b) providing a non-solidified filler containing a liquid metal;
(c) mixing the non-solidified filler into the liquid adhesive;
(d) contacting the liquid adhesive to the surfaces;
(e) contacting separate spaced regions of the dispersed filler in non-solidified state to the surfaces, each of said regions contacting both surfaces without contacting other of said regions; and
(f) transforming the liquid adhesive into a harder adhesive which provides a mechanical bond between the surfaces wherein the filler in each region provides a separate continuous thermally and electrically conductive path between and in contact with the surfaces.

28. The method of claim 27 wherein the non-solidified filler is in the range of 20% to 70% of the mixture by volume.

29. The method of claim 28 wherein the liquid adhesive is sufficiently viscous to prevent the separate spaced regions from coalescing or separating.

30. The method of claim 29 wherein the non-solidified filler is liquid gallium and the liquid adhesive is an epoxy.

31. A method of bonding two surfaces with a thermally and electrically conductive adhesive material, comprising the steps of:
(a) providing a partially cured unhardened adhesive;
(b) providing a non-solidified filler containing a liquid metal;
(c) mixing non-solidified filler into the partially cured adhesive;
(d) contacting the partially cured unhardened adhesive to the surfaces;
(e) contacting separate spaced regions of the dispersed non-solidified filler to the surfaces, each of said regions contacting both surfaces without contacting other of said regions; and
(f) transforming the partially cured unhardened adhesive into a harder adhesive which provides a mechanical bond between the surfaces wherein the filler in each region provides a separate continuous thermally and electrically conductive path between and in contact with the surfaces.

32. The method of claim 31 wherein the unhardened adhesive is a thermoplastic material which is transformed into the harder adhesive by lowering the temperature of the adhesive.

33. The method of claim 31 wherein the unhardened adhesive is a thermosetting material which is transformed into the harder adhesive by chemical reaction in the adhesive.

34. The method of claim 31 wherein the unhardened adhesive is a ultra-violet curable material which is transformed into the harder adhesive by exposing the adhesive to ultra-violet light.

35. A method of bonding two surfaces with a thermally and electrically conductive adhesive material, comprising the steps of:
(a) providing an unhardened adhesive;
(b) providing a filler containing a liquid metal;
(c) dispersing the filler into the unhardened adhesive;
(d) providing a plurality of solid spacer particles;
(e) dispersing the spacer particles into the unhardened adhesive;
(f) contacting the unhardened adhesive to the surfaces;
(g) contacting separate spaced regions of the dispersed filler in non-solidified state to the surfaces, each of said regions contacting both surfaces without contacting other of said regions, and contacting the spacer particles to the surfaces thereby assuring a spacing between the surfaces; and
(h) transforming the unhardened adhesive into a harder adhesive which provides a mechanical bond between the surfaces wherein the filler in each region provides a separate continuous thermally and electrically conductive path between and in contact with the surfaces.

36. The method of claim 35 wherein the spacer particles are glass beads.

37. The method of claim 34 wherein the unhardened adhesive is a flexible adhesive film, and the dispersing step (c) includes:
forming vias between the top and bottom surfaces of the flexible adhesive film; and depositing non-solidified filler into the vias.

38. The method of claim 37, further comprising:
contacting the flexible adhesive film to one of the bonded surfaces;
depositing non-solidified filler into the vias thereby contacting non-solidified filler to said one of the two surfaces; and
contacting the flexible adhesive film and non-solidified filler to the other of the bonded surfaces.

39. The method of claim 1, further including
a first electronic component comprising a first surface, said first surface being one of the bonded surfaces and containing first electrical bonding pads;
a second electronic component comprising a second surface, said second surface being the other of the bonded surfaces and containing second electrical bonding pads, wherein the first and second pads are in one-to-one correspondence with one another; and
disposing the components during the contacting step (e) so that the first and second pads are aligned with one another and thereby form matching pairs of first and second pads, and the non-solidified filler in the separate spaced regions connects each pair of matching pads without connecting any non-matching pads, thereby providing anisotropic electrical connection between each pair of matching pads.

40. The method of claim 39 wherein the non-solidified filler in a plurality of the separate spaced regions is between and in contact with each pair of matching pads.

41. The method of claim 34, further including
a first electronic component comprising a first surface, said first surface being one of the bonded surfaces and containing first electrical bonding pads;
a second electronic component comprising a second surface, said second surface being the other of the bonded surfaces and containing second electrical bonding pads, wherein the first and second pads are in one-to-one correspondence with one another; and
disposing the components during the contacting step (e) so that the first and second pads are aligned with one another and thereby form matching pairs of first and second pads, and the non-solidified filler in the separate spaced regions connects each pair of matching pads without connecting any non-matching pads, thereby providing anisotropic electrical connection between each pair of matching pads;
wherein the unhardened adhesive is a flexible adhesive film with a spaced separate via between each pair of matching pads, and the separate spaced regions reside in the vias.

42. The method of claim 39 wherein the first component is an integrated circuit chip and the second component is an electrical interconnect substrate.

43. The method of claim 1, further including
a lead with an outer lead end, said outer lead end providing one of the bonded surfaces;
an electrical bonding pad, said bonding pad being the other of the bonded surfaces; and
a bond between the bonded surfaces comprising the harder adhesive and the paths.

44. The method of claim 43, further including
an electronic component comprising a plurality of the leads with outer lead ends, said leads extending outwardly from the electronic component;
an electrical interconnect substrate comprising a plurality of the electrical bonding pads; and
a plurality of the bonds such that each of the outer lead ends is bonded to a separate bonding pad, thereby surface mounting the electronic component on the substrate wherein the thermal, electrical and mechanical connections between the electronic component and the substrate include the outer lead ends and the bonds.

45. A method of bonding two surfaces with a thermally and electrically conductive adhesive material, comprising the steps of:
(a) providing an unhardened adhesive;
(b) providing a filler containing a liquid metal;
(c) providing an electronic component comprising a plurality of the leads with outer lead ends, said leads extending outwardly from the electronic component, said outer lead ends providing one of the bonded surfaces;
(d) providing an electrical interconnect substrate comprising a plurality of the electrical bonding pads, said bondings pad being the other of the bonded surfaces;
(e) dispersing the filler into the unhardened adhesive;
(f) disposing a mixture of the unhardened adhesive and dispersed filler onto the bonding pads;
(g) inserting the outer lead ends into the mixture on the bonding pads such that the mixture surrounds the outer lead ends;
(h) contacting separate spaced regions of the dispersed filler in non-solidified state to the surfaces, each of said regions contacting both surfaces without contacting other of said regions;
(i) transforming the unhardened adhesive into a harder adhesive which provides a mechanical bond between the surfaces wherein the filler in each region provides a separate continuous thermally and electrically conductive path between and in contact with the surfaces; and
(j) forming a plurality of the bonds between the surfaces, each bond comprising the harder adhesive and the paths, such that each of the outer lead ends is bonded to a separate bonding pad thereby surface mounting the electronic component on the substrate wherein the thermal, electrical and mechanical connections between the electronic component and the substrate include the outer lead ends and the bonds;
wherein steps (f), (f) and (i) are performed in sequence.

46. A pair of adhesively bonded surfaces formed in accordance with the steps of claim 1.

47. A method of bonding two electrical components with a thermally and electrically conductive adhesive material, comprising the steps of:
(a) providing a first electrical component containing a first surface with first bonding pads;
(b) providing a second component containing a second surface with second bonding pads, the first and second pads being in one-to-one correspondence with one another and forming matching pairs of pads;
(c) providing a liquid adhesive;
(d) providing liquid gallium;

(e) randomly dispersing the liquid gallium into the liquid adhesive;

(f) vertically aligning the components so as to form matching pairs of first and second pads;

(g) contacting the liquid adhesive to the surfaces;

(h) contacting separate spaced regions of the dispersed liquid gallium to the surfaces, the regions contacting both surfaces without contacting other of said regions wherein each matching pair of pads is connected by at least one region therebetween before the completion of step (i); and (i) transforming the liquid adhesive into a solid adhesive which provides a secure mechanical bond between the surfaces wherein the liquid gallium in the regions between each matching pair of pads provides a continuous thermally and electrically conductive metal bridge connecting the matching pair of pads without connecting any non-matching pads.

48. A method of bonding two surfaces with a thermally and electrically conductive adhesive material, comprising the following steps in the sequence set forth:

(a) randomly dispersing a filler containing a liquid metal into an unhardened adhesive;

(b) contacting the unhardened adhesive and the filler in non-solidified state to the surfaces resulting in separate spaced regions of the non-solidified filler contacting both surfaces before the completion of step (c); and (c) increasing the hardness of the unhardened adhesive to form a harder adhesive which provides a mechanical bond between the surfaces wherein the filler in each region provides a separate continuous thermally and electrically conductive metal bridge between and in contact with the surfaces.

49. A method of bonding two surfaces with a thermally conductive adhesive material, comprising the steps of:

(a) providing an unhardened adhesive;

(b) providing a filler containing a liquid metal;

(c) randomly dispersing the filler into the unhardened adhesive;

(d) contacting the unhardened adhesive containing the filler in non-solidified state to the surfaces before the completion of step (e); and (e) hardening the unhardened adhesive wherein a harder adhesive provides a mechanical bond between the surfaces and the filler provides a thermally conductive path between the surfaces.

50. A bonded assembly of electrical components, comprising:

a first electrical component;

a second electrical component; and a thermally and electrically conductive adhesive bonding material positioned between the components, said adhesive bonding material comprising:

(i) an adhesive in contact with the components so as to mechanically bond the components, (ii) a non-solidified filler containing a liquid metal dispersed in separate spaced regions of the adhesive wherein the filler in each region contacts the components and forms a continuous thermally and electrically conductive metal bridge between the components, and (iii) a plurality of solid spacer particles, each spacer particle in contact with both components thereby assuring a spacing between the components.

51. The assembly of claim 50 wherein the liquid metal is selected from the group consisting of gallium, gallium/indium, gallium/indium/tin and mercury.

52. The assembly of claim 50 wherein the temperature of the non-solidified filler is no greater than 160° C.

53. The assembly of claim 50 wherein the adhesive is selected from the group consisting of thermoplastics, thermosetting materials, epoxies and silicone gels.

54. The assembly of claim 50 wherein the filler is gallium and the adhesive is an epoxy.

55. The assembly of claim 54 wherein the gallium occupies in the range of 20% to 70% of the volume of the adhesive bonding material.

56. The assembly of claim 50 wherein the spacer particles are glass beads.

57. The assembly of claim 50, wherein the first electrical component is an integrated circuit chip with a bottom surface, said bottom surface containing first electrical bonding pads and in contact with the adhesive bonding material;

the second electrical component is an electrical interconnect substrate with a top surface, said top surface containing second electrical bonding pads and in contact with the adhesive bonding material, wherein the first and second pads are in one-to-one correspondence with one another and the components are vertically aligned so as to form matching pairs of first and second pads; and each matching pair of first and second pads is interconnected by at least one metal bridge without any non-matching first and second pads being interconnected by any metal bridge, thereby providing anisotropic electrical connection between the matching pairs of pads.

58. The assembly of claim 57 wherein the adhesive bonding material contains a plurality of vias extending between the components, each via being positioned directly between a matching pair of first and second pads wherein the metal bridges are disposed inside the vias.

59. A bonded assembly of electrical components, comprising:

a thermally and electrically conductive adhesive bonding material positioned between and bonded to the insulating layer and the metallization layer, said adhesive bonding material comprising:

(i) an adhesive in contact with the chip and the substrate so as to mechanically bond the chip and the substrate, and (ii) a non-solidified filler containing a liquid metal dispersed in separate spaced regions of the adhesive wherein the filler in each region contacts the chip and the substrate and forms a continuous thermally and electrically conductive metal bridge between the chip and the substrate, wherein the insulating layer electrically isolates the chip from the metallized layer of the substrate.

60. The assembly of claim 50, wherein the first electrical component comprises outwardly extending leads with outer lead ends;

the second electrical component is an electrical interconnect substrate comprising electrical bonding pads; and the adhesive bonding material contacts the first component at the outer lead ends and bonds the outer lead ends to the pads in one-to-one correspondence, thereby surface mounting the electrical component on the substrate.

61. The assembly of claim 60, wherein
the adhesive bonding material contacts the first component only at the outer lead ends; and
the entire thermal, electrical and mechanical connection between the first electrical component and the substrate includes the outer lead ends and the adhesive bonding material.
62. The assembly of claim 50, wherein
the liquid metal contains gallium;
at least one of the components includes a coating which is compatible with gallium and is wet by gallium; and
the gallium contacts the coating.

63. The method of claim 1 wherein step (d) is performed before step (e).
64. The method of claim 1 wherein the surfaces are brought closer together between steps (d) and (e).
65. The method of claim 1 wherein step (e) is performed before beginning step (f).
66. The method of claim 1 wherein the separate spaced regions of the dispersed filler have random sizes.
67. The method of claim 1 wherein the separate spaced regions of the dispersed filler have random shapes.
68. The method of claim 1 wherein the unhardened adhesive is a liquid.

* * * * *